United States Patent
Pennisi et al.

(10) Patent No.: US 7,741,916 B2
(45) Date of Patent: Jun. 22, 2010

(54) RECONFIGURABLE CIRCUIT TO COMPENSATE FOR A LOW NOISE AMPLIFICATION INPUT MATCHING VARIATION AND A METHOD FOR ITS CONFIGURATION

(75) Inventors: Salvatore Pennisi, Allen, TX (US); Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 12/032,317

(22) Filed: Feb. 15, 2008

(65) Prior Publication Data
US 2009/0206935 A1 Aug. 20, 2009

(51) Int. Cl.
*H03F 3/191* (2006.01)
(52) U.S. Cl. ...................................... 330/305
(58) Field of Classification Search .................. 330/305, 330/277, 295, 84, 51
See application file for complete search history.

(56) References Cited

U.S. PATENT DOCUMENTS 7,078,968 B2 * 7/2006 Gaeta et al. ................. 330/254

* cited by examiner

*Primary Examiner*—Robert Pascal
*Assistant Examiner*—Hieu P Nguyen
(74) *Attorney, Agent, or Firm*—Wade J. Brady, III; Frederick J. Telecky, Jr.

(57) ABSTRACT

A method for changing an effective capacitance of an amplifier circuit having a match transistor and a coupled cascode transistor includes changing an on-state of at least one of a plurality of sub-transistors of the match transistor. The method further includes changing a transconductance of the match transistor as a function of the change of the on-state. The method further includes changing an equivalent resistance, as measured between a source and a drain of the cascode transistor, as a function of the change of the transconductance of the match transistor.

14 Claims, 3 Drawing Sheets

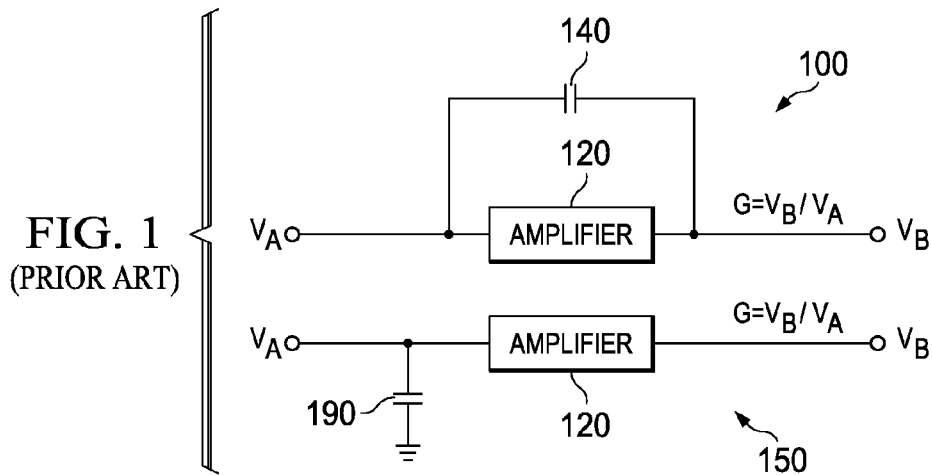
FIG. 1 (PRIOR ART)
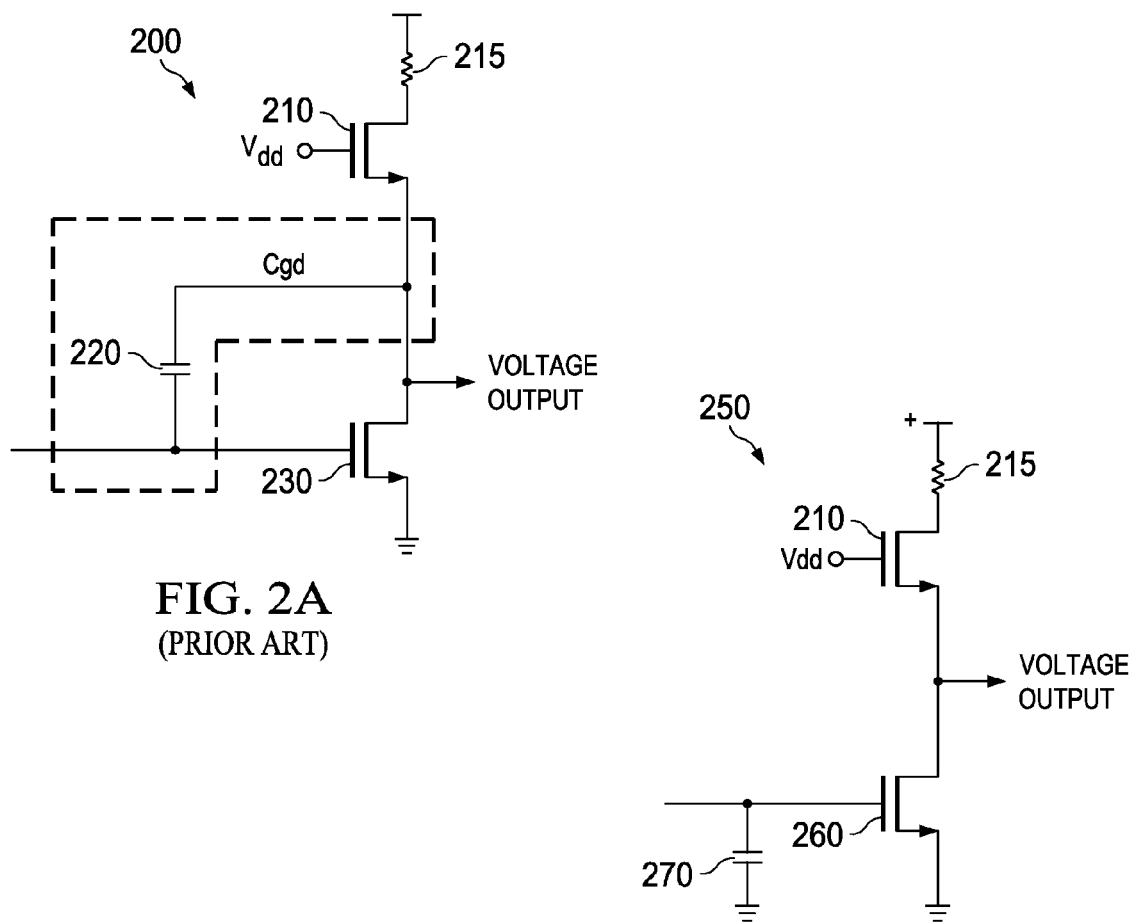
FIG. 2A (PRIOR ART)
FIG. 2B (PRIOR ART)

US 7,741,916 B2

RECONFIGURABLE CIRCUIT TO COMPENSATE FOR A LOW NOISE AMPLIFICATION INPUT MATCHING VARIATION AND A METHOD FOR ITS CONFIGURATION

TECHNICAL FIELD OF THE INVENTION

The invention is directed, in general, to a low-noise amplifier and, more specifically, to a low noise amplifier that can dynamically vary its input impedance.

BACKGROUND OF THE INVENTION

Wireless technologies are of great importance in today's marketplace, and will continue to be so in the future. In wireless technologies, one figure of merit is a degree of impedance "match" between an antenna and amplifier of a wireless device.

A proper input matching has a great influence on both a gain and a noise factor of an amplifier. Components of wireless devices, such as surface acoustic wave ("SAW") filters, work properly only when a correct impedance is presented at its terminals. Typically, the amplifier should be able to maintain its performance even for a voltage standing wave ratio ("VSWR") of 3:1.

However, the input impedance, as seen by the wireless device, can change over time. Therefore, an impedance mismatch occurs. This impedance mismatch can occur due to an aging antenna, a change in an orientation of the antenna, or other things.

However, there are drawbacks with prior art approaches of compensating for impedance mismatches. For instance, one or a series of physical capacitors can be placed between a gate of the amplifier and ground, or various couplings of inductors between the gate of the transistor and an input of a device under test can be placed between a gate of the amplifier and ground to achieve impedance matching. However, significant complexity and noise of the switches can be added in this aspect, and significant integrated circuit area can be consumed.

Accordingly, what is needed in the art is a system and a method to match input impedances that addresses the drawbacks of the prior art.

SUMMARY OF THE INVENTION

To address the above-discussed deficiencies of the prior art, one aspect of the invention provides a method for changing an effective capacitance of an input of an amplifier circuit having a match transistor and a coupled common source ("CS") transistor. In one embodiment, the method includes changing an on-state of at least one of a plurality of sub-transistors of the match transistor and changing a transconductance of the match transistor as a function of the change of the on-state. The method further includes changing an equivalent resistance, as measured between a source and a drain of the cascode transistor, as a function of the change of the transconductance of the match transistor. The method further includes changing a gain of the coupled CS transistor as a function of a change of the equivalent resistance. The method still further includes changing a gate input impedance of the CS transistor as a function of the changed effective capacitance.

In a second aspect, the invention provides a low noise amplification input-matching variation compensation circuit. In one embodiment, the circuit includes a CS transistor having an intrinsic capacitance and coupled between a drain and a gate of the CS transistor, the intrinsic capacitance having a corresponding effective capacitance, the effective capacitance affecting an amplification characteristic of the CS transistor. The circuit further includes a match transistor, including a plurality of sub-transistors, coupled to the CS transistor and configured to alter the effective capacitance of the CS transistor to a new effective capacitance as a function of a number of the sub-transistors in the match transistor that are enabled.

In a third aspect, the invention provides a system for changing an effective capacitance of an input of an amplifier circuit. In one embodiment, the system includes a match transistor, a CS transistor coupled to the match transistor, and an adaptive algorithm processor that changes a transconductance of the match transistor as a function of a voltage measured at a source of the match transistor.

BRIEF DESCRIPTION OF THE DRAWINGS

For a more complete understanding of the invention, reference is now made to the following descriptions taken in conjunction with the accompanying drawings, in which:

FIG. 1 is a diagram of a circuit having a capacitance and a gain and illustrating the Miller Effect;

FIG. 2A is a diagram of an embodiment of a prior art amplifier having an intrinsic input capacitance;

FIG. 2B is a diagram of an embodiment a prior art amplifier having an extrinsic capacitance illustrating the Miller Effect;

DETAILED DESCRIPTION

Figure 3:
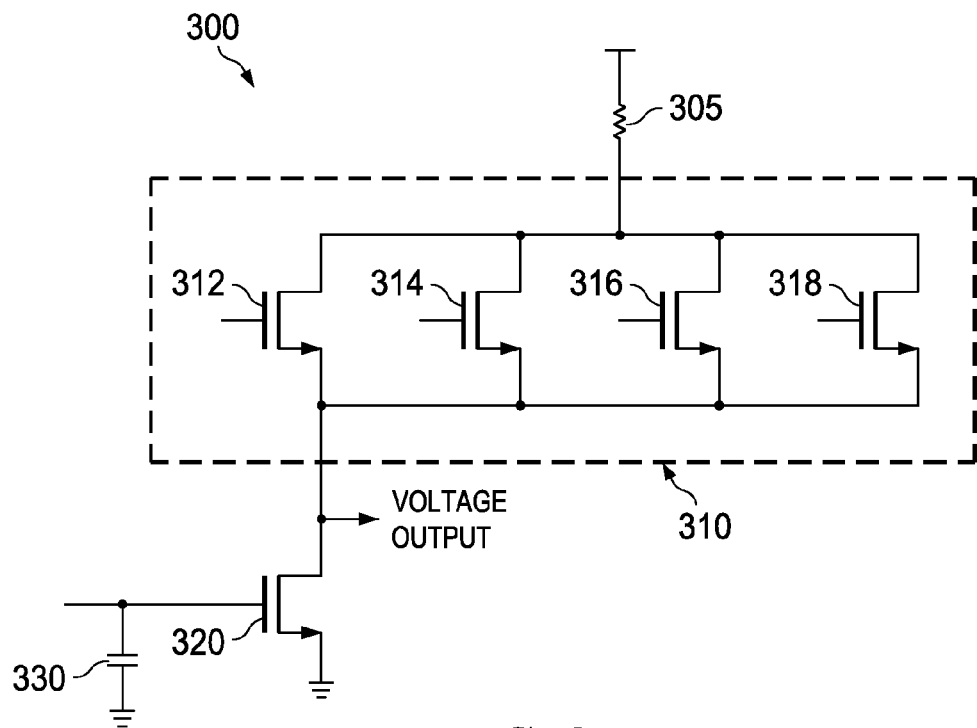
FIG. 3 is a diagram of an embodiment of a circuit having a match transistor having sub-transistors that affect a Miller Gain of an intrinsic capacitance of a CS transistor.

FIG. 1 is a diagram of a circuit having a capacitance and a gain and illustrating a prior art Miller Effect. Generally, the "Miller Effect" refers to a calculation of an equivalent capacitance in a circuit having a capacitance and a gain, as will be described below.

In a system 100, an amplifier 120, having an input "A" and an output "B," has a gain "G" expressed as $V_b/V_a$. A capacitor 140 is coupled between input A and output B having a capacitive value of "C." The gain "G" is partially a function of the capacitive value "C."

In an equivalent system 150, according to the Miller Effect, the gain, "G" remains the same, but the capacitance 140 can now be expressed as an equivalent capacitance 190 coupled between input "A" and ground. The value of the Capacitance 190 is:

$$\text{Miller Capacitance} = C \cdot (1-G)$$

In other words, a capacitance, coupled in parallel across an input and an output of an amplifier may be replaced by an "equivalent" or "effective" Miller capacitance at an input of the amplifier coupled to ground.

FIG. 2A is a diagram of an embodiment of an effect of the Miller Effect in a cascode amplifier circuit 200. A cascode transistor 210, such as a field-effect transistor (FET), is coupled in a cascode configuration to a common source (CS)

transistor 230. A drain of the cascode transistor 210 is coupled to a resistor 215, and a gate of the cascade transistor 210 is coupled to a voltage source Vdd. A source of the cascode transistor 210 is coupled to a drain of a CS transistor 230. A voltage output of the circuit 200 may be measured at a node at the source of the cascode transistor 210.

A source of the CS transistor 230 is coupled to ground, although, in other embodiments, an impedance could be interposed between the source of the CS transistor 230 and ground. However, an intrinsic capacitance of the CS transistor 230, Cgd, is illustrated as coupled from the gate to the drain of the CS transistor 230. An input to the gate of the CS transistor 230 perceives this as a capacitance.

FIG. 2B is a diagram of an embodiment of a prior art amplifier 250 having an equivalent Miller input capacitance. The intrinsic capacitance, $C_{gd}$, has been equivalently expressed as a Miller Effect capacitor 270. The value of the equivalent Miller Effect capacitor is the intrinsic capacitance "C" times {1—"Gain of the CS transistor 260"}. Therefore, as is illustrated, the Miller equivalent of Cgd, the Miller Effect capacitor 270, has a much greater nominal value, although this nominal value is coupled in parallel to the CS transistor 260.

FIG. 3 is a diagram of an embodiment of a cascode amplifier 300 for changing an effective capacitance of an amplifier. The amplifier 300 has a CS transistor 320. The CS transistor 320 has an intrinsic capacitance situated between its drain and its gate. The intrinsic capacitance is expressed as its equivalent miller effect capacitance 330 (an "effective" capacitance).

In the cascode amplifier 300, the effective capacitance 330 can be advantageously manipulated as will be calculated below. The manipulation of the effective capacitance 330 affects an amplification characteristic of the CS transistor 320, because the amplification characteristic of the CS transistor 320 is at least a partial function of the effective capacitance. The effective capacitance, therefore, affects the impedance matching abilities of the cascode amplifier 300. In the cascode amplifier 300, a gain of the CS transistor 320 is altered, thereby affecting the value of the effective capacitance 330, which in turn affects the input impedance of the cascode amplifier 300. In one embodiment, in the amplifier 300, although a gain of the CS transistor 320 is affected, the overall gain of the cascode amplifier 300 remains substantially constant.

However, in the cascode amplifier 300, the gain of the CS transistor 320, and hence the magnitude of the Miller Effect when calculating the Miller Effect capacitance, is a function of a transconductance of a coupled cascode transistor 310, as will be detailed below. Generally, through adjusting the transconductance of the cascode transistor 310, the effective capacitance 330 can also be adjusted, thereby altering the input impedance. The gain of the CS transistor 320 can be changed by adjusting the transconductance of the coupled cascode transistor 310. In some embodiments, changing the transconductance of the cascode transistor 310 does not substantially change the gain of the amplifier 300.

The amplifier 300 has a resistor 305 coupled to a positive voltage rail. The resistor 305 is coupled to the match transistor 310. In this specification, a "match transistor" can be generally defined as a cascode transistor in a cascode circuit. For example, in FIG. 3, for the illustrated cascade configuration, the transistor 320 is a CS transistor, therefore the transistor 310 is the match transistor. Changing the transconductance of the match transistor 310, changes the effective ("Miller Effect") capacitance of the CS transistor into effective capacitance 330, without substantially changing the gain of the amplifier 300, as will be described below.

The match transistor 310 includes a plurality of sub-transistors 312-318, coupled in parallel to the CS transistor 320, although in some embodiments, the numbers of sub-transistors can be ten or more. In the cascode amplifier circuit 300, the match transistor 310 can alter the effective miller capacitance 330 of the CS transistor 320 to a new effective capacitance. This occurs as a function of a number of the sub-transistors 312-318 in the match transistor 310 that are enabled at a given point in time, as will be described below. The transconductance of the match transistor 310 may be altered by enabling or disabling sub-transistors 312-318. If this is the mechanism for changing the transconductance, these sub-transistors, which are coupled in parallel, effectively add to or subtract the active dimensions of the match transistor 310, thereby changing its transconductance.

Generally, the single-ended low noise amplification ("LNA") input resistance, as seen when looking into a gate of the CS transistor 320, is dependent upon the Miller capacitance. Neglecting source degeneration and using first-order approximation, $$C_{Miller} = C_{gd}*(1+g_m \text{ common source transistor}/g_m \text{ cascode transistor}).$$

In other words, by changing the transconductance of match transistor 310, the effective capacitance 330 of the CS transistor 320 is altered.

In the cascode circuit 300, the gain of the CS transistor 320 can be generally described as depending upon a transconductance of the match transistor 310. By enabling and disabling the sub-transistors 312-318, the transconductance of the match transistor 310 is altered. As this is an alteration of the transconductance, and hence the resistance, seen by the drain of the CS transistor 320, this in turn alters the gain seen by the CS transistor 320. This change in gain, in turn, alters the value of the effective capacitance 330, which enables impedance matching into the cascode amplifier 300.

The above relationships may be reflected in the mathematical relationships that "$1/g_m$" (i.e., the resistance) of the cascade transistor 310 is inversely proportional to the square root of the value of the width of the match transistor 310 divided by the length of the math transistor 310. In the amplifier 300, the length is typically held substantially constant, as the sub-transistors 312-318 are coupled in parallel. However, the width typically varies with the number of sub-transistors 312-318 that are enabled or disabled. For example, disabling more sub-transistors increases the resistance seen by the CS 320 at its drain. This, in turn, increases the gain of the CS 320. Increasing the gain of the CS 320 therefore increases the effective capacitance 330, allowing impedance matching. Similarly, increasing the width by enabling various sub-transistors 312-318 also affects the gain of the CS 320, which can decrease the effective capacitance 330, allowing impedance matching.

In some aspects, each sub-transistor of the match transistor 310 is coupled in parallel to one another. In some aspects, each sub-transistor of the match transistor 310 has substantially the same dimensions. Furthermore, an overall gain of the cascade circuit 300 remains substantially constant, notwithstanding a change of a transconductance of the match transistor 310 or a corresponding (e.g., inversely proportional) change of the gain of the CS transistor 320.

Generally, in conventional technologies, cascode transistors are used to lessen or minimize changes in resistance seen by a drain of a CS transistor, thereby minimizing changes in the effective Miller capacitance. Generally, the present disclosure advantageously recognizes that a deliberate manipulation of the resistance seen by a drain of a CS transistor can advantageously deliberately induce changes in the Miller capacitance, as opposed to lessening or minimize this change of the resistance seen by a drain of a CS transistor, as in conventional technologies. In the present disclosure, these deliberately-induced changes in the Miller capacitance can therefore be used in impedance matching.

Figure 4:
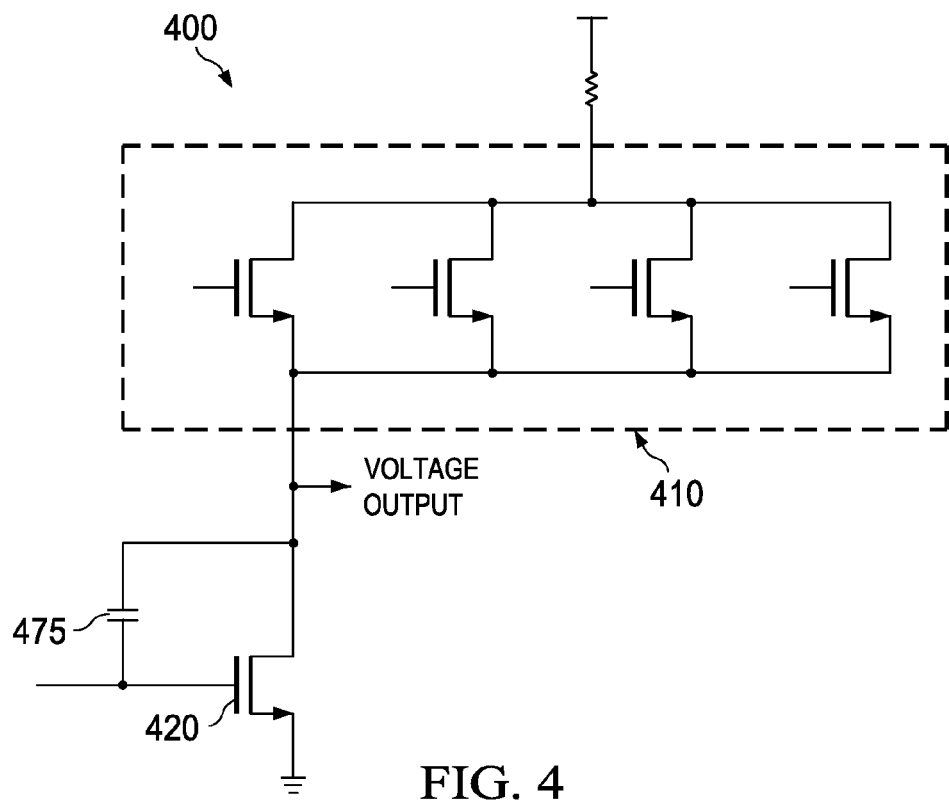
FIG. 4 is a diagram of an embodiment of a circuit having a match transistor having sub-transistors that affect a Miller Gain of capacitor coupled to a gate and a drain of a CS transistor.

FIG. 4 is a diagram of a further embodiment of a system 400 for changing a matching transistor impedance, thereby changing an input impedance. The system 400 includes an external (i.e., non-intrinsic) capacitance 475. The capacitance 475 is coupled to the gate and the drain of the CS transistor 420. The non-intrinsic capacitor 475 therefore has an equivalent Miller capacitance, coupled between the gate of the CS 420 and ground (not illustrated) that can be selectively altered by the enablement or disablement of various sub-transistors of a coupled match transistor 410.

Figure 5:
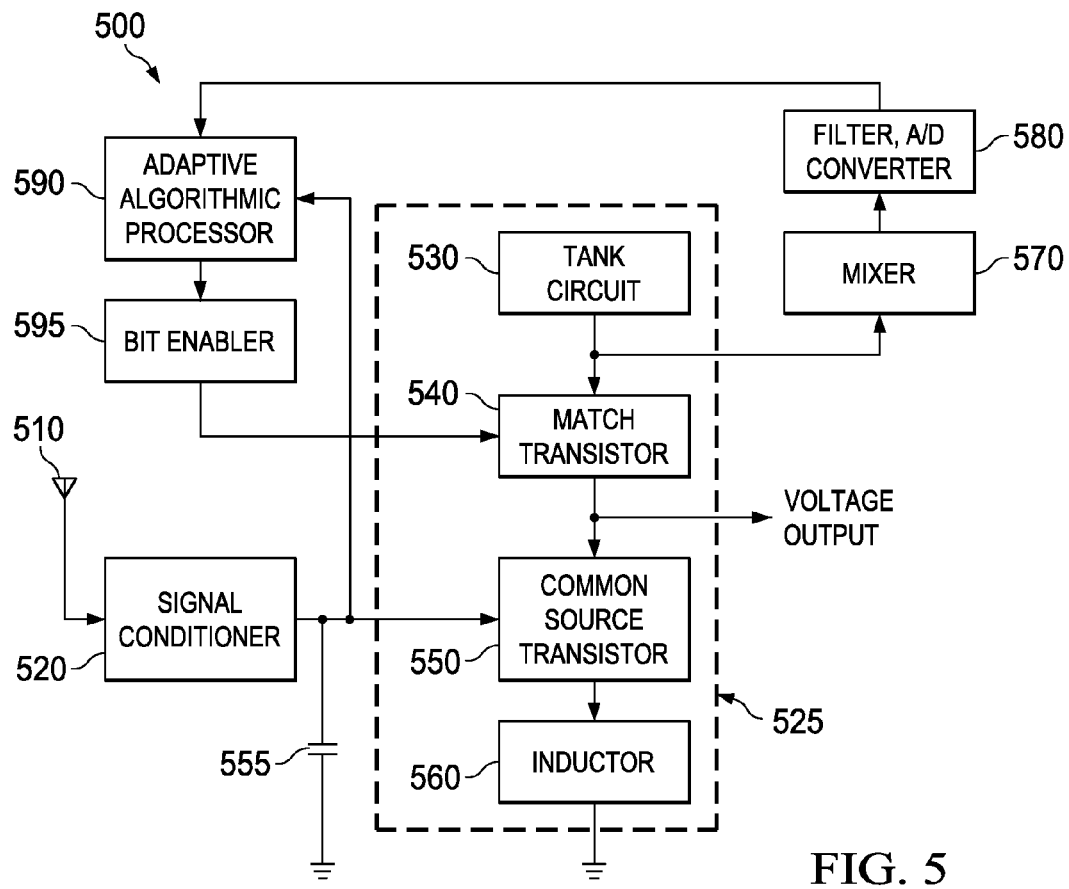
FIG. 5 is a diagram of an embodiment of a system for dynamically changing a gain using the Miller Effect.

FIG. 5 is a diagram of an embodiment of a system 500 for employment with a match transistor having sub-transistors, such as the match transistor 310 of the circuit 300. In one embodiment, the system 500 is a mobile phone. In the system 500, an antenna 510 is coupled to a signal conditioner 520. The signal conditioner 520 is coupled to a cascode amplifier 525. In some embodiments, the signal conditioner 520 is also coupled to an adaptive algorithm processor 590, as will be described below.

The cascode amplifier 525 has a tank circuit 530, a coupled match transistor 540, comprising a cascade transistor having a plurality of coupled sub-transistors, a coupled CS transistor 550, and a coupled inductor 560. A source of the CS transistor 550 is coupled to an inductor 560. The inductor 560 is coupled to ground. A gate of the CS transistor 550 is also coupled to an effective miller capacitance 555, which is also coupled to ground.

The CS transistor 550 is also coupled to a match transistor 540. The match transistor 540 includes a plurality of sub-transistors, coupled in parallel, which are dynamically enabled or disabled. In the present disclosure, "dynamically" can be generally defined as changing over time. This dynamic enablement or disablement changes the effective transconductance of the match transistor 540, which in turn changes the resistance experienced at the drain of the CS transistor 550. This change of resistance therefore changes the equivalent gain of the CS transistor 550, which in turn changes the effective miller capacitance 555 of the CS transistor 550, thereby changing the capacitance of the impedance seen by the signal conditioner 520.

Dynamically altering the equivalent resistance of the match transistor 540, through an enablement and disablement of sub-transistors, therefore, changes the input impedance seen at the drain of the CS transistor 550, which changes the effective miller capacitance 555. In the system 500, therefore, the match transistor 540 can be altered to compensate for changes in input capacitance, such as input capacitance measured at the signal conditioner 520.

The tank circuit 530 is coupled to the match transistor 540. The tank circuit 530 is coupled to a positive voltage rail (not illustrated). A node between the tank circuit 530 and the match transistor 540 is coupled to a mixer circuit 570. The mixer circuit 570 is coupled to a filter 580. The filter 580 is coupled to an adaptive algorithm processor 590.

In some embodiments, the adaptive algorithm processor 590 changes a gain of the match transistor 540 as a function of a voltage measured at an input of the match transistor 540 expressed by the mixer 570 and the filter 580. In one embodiment, the adaptive algorithm process 590 uses a feedback loop from the filter 580 and an output from the signal conditioner 520 to determine what the effective capacitance of the effective miller capacitance 555 should be to allow input impedance matching between the output of the signal conditioner 520 and an input of the CS transistor 560. This is generally done to maximize the signal that is input into the gate of the CS transistor 550.

The adaptive algorithm processor 590 dynamically changes the effective miller capacitance 555 of the circuit 500, such as maximizing a transfer of an input signal, by receiving output from the filter circuit 580, comparing this to an output of the signal conditioner 520, and then dynamically determining a number of sub-transistors to dynamically enable or disable at a given time. Generally, the adaptive algorithm processor 590 is configured to increase a dynamic range of an amplification associated with the CS transistor 550 and the match transistor 560.

The adaptive algorithm processor 590 is coupled to a bit enabler 595. The bit enabler 595 is coupled to the match transistor 540. More specifically, the bit enabler 595 is coupled to the individual sub-transistors of the match transistor 540, and selectively enables or disables these sub-transistors. Advantageously, a transconductance of the match transistor 540 is varied without substantially varying a gain of the amplifier circuit 525 itself.

Figure 6:
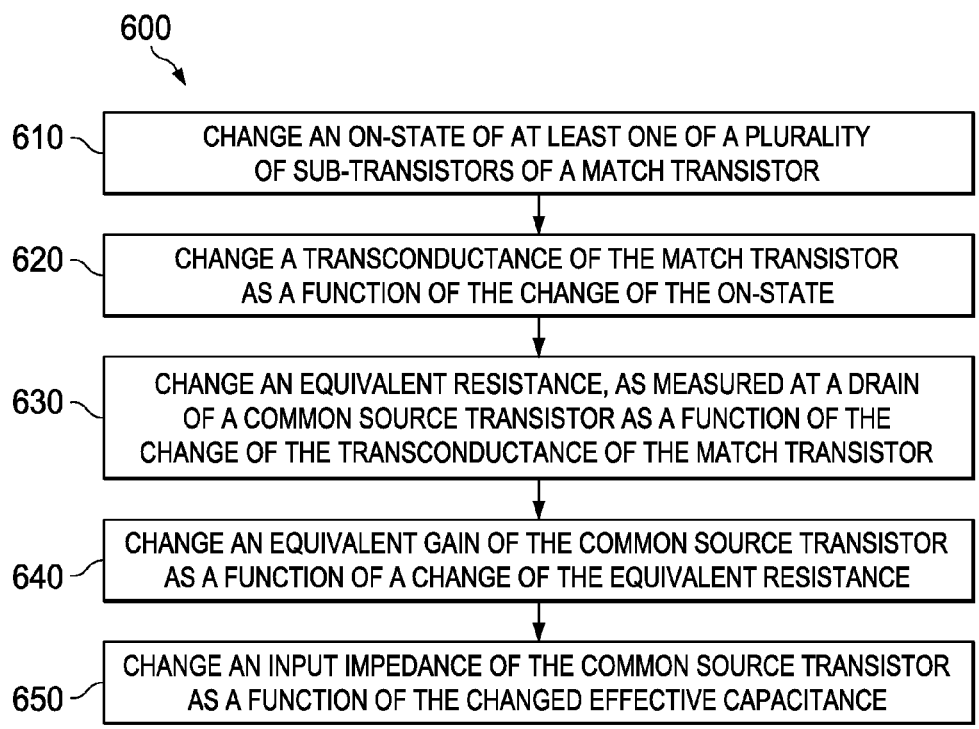
FIG. 6 is a flow chart of an embodiment of a method for changing the equivalent resistance of an amplifier circuit.

FIG. 6 is a flow chart of an embodiment of a method 600 for changing an effective capacitance of a cascode amplifier circuit having a match transistor and a coupled CS transistor.

In a step 610, an on-state of at least one of a plurality of sub-transistors of the match transistor is changed. In one aspect, the sub-transistors are coupled in parallel to one another. In one aspect, the sub-transistors on-states are changed by an output of an adaptive algorithm processor. In one aspect, the adaptive algorithm processor changes the sub-transistor as a result of a change of an environmental factor associated with the cascode amplifier circuit. In some aspects, the change of an environmental factor is measured by an antenna, and is expressed as a change of capacitance.

In a step 620, a transconductance of the match transistor is changed as a function of the change of the on-state of at least one sub-transistor.

In a step 630, an equivalent resistance is changed, as measured at a drain of a CS transistor, as a function of the change of a gain of the match transistor.

In a step 640, a gain of the coupled CS transistor is changed as a function of a change of the equivalent resistance, and hence the gain of the match transistor.

In a step 650, a gate impedance of the CS transistor is changed as a function of the changed gain of the match transistor. In one aspect, changing an input impedance is a response to a change of an input impedance of the amplifier circuit as measured at the drain of the cascode transistor. In one aspect, a substantial change of the effective Miller capacitance does not substantially change a gain of a cascode amplifier circuit. The effective Miller capacitance is a function of at least an intrinsic capacitance that occurs between a drain and a gate of the CS transistor. The effective Miller capacitance is therefore calculated to be situated instead between a gate of the CS transistor and ground. In one aspect, the effective capacitance is changed in response to an alteration of an orientation of an antenna associated with a cascode amplifier circuit having the CS transistor and the match transistor.

Those skilled in the art to which the invention relates will appreciate that other and further additions, deletions, substitutions and modifications may be made to the described embodiments without departing from the scope of the invention.

What is claimed is:

1. A method of changing an effective capacitance of an input of an amplifier circuit having a match transistor and a coupled common source ("CS") transistor, comprising:
    changing an on-state of at least one of a plurality of sub-transistors of said match transistor;
    changing a transconductance of said match transistor as a function of said change of said on-state;
    changing an equivalent resistance, as measured at a drain of said CS transistor, as a function of said change of said transconductance of said match transistor;
    changing a gain of said coupled CS transistor as a function of a change of said equivalent resistance; and
    changing a gate input impedance of said CS transistor as a function of said changed effective capacitance;
    wherein said sub-transistors on-states are changed by an output of an adaptive algorithmic processor.

2. The method as recited in claim 1 wherein said sub-transistors are coupled in parallel to one another.

3. The method as recited in claim 1 wherein said adaptive algorithm processor changes said sub-transistor as a result of a change of an environmental factor associated with said amplifier circuit.

4. The method as recited in claim 1 wherein said CS transistor is a field-effect transistor.

5. The method of claim 1, wherein said effective capacitance is a function of at least an intrinsic capacitance that occurs between a gate and a drain of said CS transistor.

6. The method as recited in claim 1 wherein said changes of said sub-transistor on states occur as a result of a change of an orientation of an antenna associated with said amplifier circuit.

7. The method as recited in claim 1 wherein a gain of said amplifier circuit is substantially independent of a change of said effective capacitance.

8. A low noise amplification input-matching variation compensation circuit, comprising:
    a common source ("CS") transistor having an intrinsic capacitance and coupled between a drain and a gate of said CS transistor, said intrinsic capacitance having a corresponding effective capacitance, said effective capacitance affecting an amplification characteristic of said CS transistor;
    a match transistor, including a plurality of sub-transistors, coupled to said CS transistor and configured to alter said effective capacitance of said CS transistor to a new effective capacitance as a function of a number of said sub-transistors in said match transistor that are enabled; and
    a second capacitor coupled to said gate and said source of said cascode transistor.

9. The circuit as recited in claim 8 wherein each sub-transistor of said match transistor is coupled in parallel to one another.

10. The circuit as recited in claim 8 wherein said sub-transistors of said match transistor have dimensions that are substantially the same.

11. The circuit as recited in claim 8 wherein a gain of said match transistor is a function of a number of enabled sub-transistors of said match transistor.

12. The circuit as recited in claim 8 wherein a gain of said amplifier circuit is substantially independent of a change of said effective capacitance.

13. The circuit as recited in claim 8 wherein a transconductance of said match transistor is a function of an amount of enabled sub-transistors of said match transistor.

14. The circuit as recited in claim 8 wherein an effective capacitance associated with said second capacitor is altered as a function of a number of sub-transistors of said match transistor that are enabled.

* * * * *